United States Patent [19]
Hashimoto et al.

[11] Patent Number: 5,001,359
[45] Date of Patent: Mar. 19, 1991

[54] SCANNING CIRCUIT OUTPUTTING SCANNING PULSE SIGNALS OF TWO OR MORE PHASES

[75] Inventors: Seiji Hashimoto, Yokohama; Hayao Ohzu, Fuchu, both of Japan

[73] Assignee: Canon Kabushiki Kaisha, Tokyo, Japan

[21] Appl. No.: 545,648

[22] Filed: Jun. 29, 1990

Related U.S. Application Data

[63] Continuation of Ser. No. 261,264, Oct. 22, 1988, Pat. No. 4,958,085.

[30] Foreign Application Priority Data

Oct. 30, 1987 [JP] Japan .................. 62-273185
Nov. 6, 1987 [JP] Japan .................. 62-279389

[51] Int. Cl.$^5$ .................... H03K 5/00; H04N 3/14
[52] U.S. Cl. .................... 307/262; 307/511; 328/109; 328/155; 328/55; 358/213.15
[58] Field of Search .............. 307/269, 262, 518, 511, 307/311; 328/63, 72, 109, 155, 55, 133; 358/213.11, 213.15, 213.27, 213.31

[56] References Cited

U.S. PATENT DOCUMENTS

| | | | |
|---|---|---|---|
| 4,538,288 | 8/1985 | Soneda et al. | 307/269 |
| 4,794,275 | 12/1988 | Traa | 307/269 |
| 4,802,012 | 1/1989 | Nobue et al. | 358/213.15 |
| 4,839,729 | 6/1989 | Ando et al. | 358/213.15 |
| 4,845,437 | 7/1989 | Mansur et al. | 307/269 |
| 4,910,597 | 3/1990 | Harada et al. | 358/213.15 |
| 4,958,085 | 9/1990 | Hashimoto et al. | 328/55 |

Primary Examiner—Stanley D. Miller
Assistant Examiner—Richard Roseen
Attorney, Agent, or Firm—Fitzpatrick, Cella, Harper & Scinto

[57] ABSTRACT

There is disclosed a scanning circuit composed of plural stages of unit circuit for releasing scanning pulses of two or more phases in succession from the unit circuits according to multiphase driving pulses, provided with set circuits for setting the unit circuits at a predetermined state and a switch circuit for activating the set circuit of a preceding unit circuit in response to the scanning pulse, wherein the switch circuits are activated by driving pulses different from the first-mentioned driving pulses.

18 Claims, 14 Drawing Sheets

FIG.5A

| SIGNAL S<br>NOISE N | S1<br>N1 | S2<br>N2 | S3<br>N3 | S4<br>N4 | S5<br>N5 | S6<br>N6 | S7<br>N7 | S8<br>N8 | S9<br>N9 |   |
|---|---|---|---|---|---|---|---|---|---|---|
| SCANNING PULSE | $\phi_{11}$ | $\phi_{21}$ | $\phi_{12}$ | $\phi_{22}$ | $\phi_{13}$ | $\phi_{23}$ | $\phi_{14}$ | $\phi_{24}$ | $\phi_{15}$ | $\phi_{25}$ |
| OUT 1 | N1→ |  | N3→ |  | N5→ |  | N7→ |  | N9→ |  |
| OUT 2 |  | S1→ |  | S3→ |  | S5→ |  | S7→ |  |  |
| OUT 3 |  | N2→ |  | N4→ |  | N6→ |  | N8→ |  | N10→ |
| OUT 4 |  |  | S2→ |  | S4→ |  | S6→ |  | S8→ |  |

FIG.5B

| SCANNING PULSE | $\phi_{11}$ | $\phi_{21}$ | $\phi_{12}$ | $\phi_{22}$ | $\phi_{13}$ | $\phi_{23}$ | $\phi_{14}$ | $\phi_{24}$ | $\phi_{15}$ |
|---|---|---|---|---|---|---|---|---|---|
| OUT 1 | N1→ |  | N3→ |  | N5→ |  | N7→ |  | N9→ |
| OUT 2 |  | S1→ |  | S3→ |  | S5→ |  | S7→ |  |
| OUT 3 |  | N2→ |  | N4→ |  | N6→ |  | N8→ |  |
| OUT 4 | → |  | S2→ |  | S4→ |  | S6→ |  | S8→ |

SCANNING CIRCUIT OUTPUTTING SCANNING PULSE SIGNALS OF TWO OR MORE PHASES

This application is a continuation of application Ser. No. 07/261,264 filed Oct. 24, 1988, now U.S. Pat. No. 4,958,085 on Sept. 18, 1990.

BACKGROUND OF THE INVENTION

1. Field of the Invention

The present invention relates to a scanning circuit composed of plural stages of unit circuits for releasing scanning pulses of two or more phases in succession according to multi-phase driving pulses.

2. Related Background Art

FIG. 1 is a schematic circuit diagram of a conventional scanning circuit.

Said conventional example is composed of n stages of units circuits, which release scanning pulses $\phi 11$, $\phi 21$, $\phi 12$, ... in succession.

In the unit circuit of the first stage, and in the presence of a start pulse $\phi hs$, a transistor M1 is rendered conductive by a pulse $\phi h2$ to elevate a potential V(1). A transistor M2 shows a conductance corresponding to said potential V(1) which is the gate potential of said transistor M2.

Then, the pulse $\phi h2$ is terminated and a pulse $\phi h1$ is started, the potential of a terminal Op1 starts to rise through the transistor M2. Said potential rise is fed back to the gate of the transistor M2 through a capacitor Cl, thereby elevating the potential V(1). As the rise of the potential V(1) increases the conductance of the transistor M2, the terminal Op1 provides a scanning pulse $\phi 11$ without voltage drop.

Also said first pulse $\phi 11$ elevates the potential V(2) of a second stage through a transistor M3. Thus, at the upshift of the pulse $\phi h2$, a terminal Op2 outputs a scanning pulse $\phi 21$ through a transistor M6.

At the same time, the pulse b2 turns on the transistor M1, thereby reducing the potential V(1) to a reference potential. Also a scanning pulse $\phi 12$ of a third stage turns on a transistor M5, thereby reducing the potential V(2) to the reference potential.

In this manner the scanning pulses are generated in succession according to the timing of the pulses $\phi ha$ and $\phi h2$.

FIG. 2A is a circuit diagram showing an example of a signal reading device utilizing a conventional scanning circuit, and FIG. 2B is a timing chart showing an example of the function thereof.

In the initial state it is assumed that capacitors Ct1, Ct2 respectively contain a sensor noise N and a sensor signal S containing noise.

At the application of a high-level scanning pulse $\phi 11$ with a pulse duration Tb, transistors Qt1 and Qs1 are turned on, whereby the sensor noise N stored in the capacitor Ct1 is released to an output line OUT1 through a bipolar transistor amplifier Q.

After the noise N is read for a duration Tc (<Tb), a pulse $\phi bc$ is shifted to the high level while the scanning pulse $\phi 11$ remains at the high level to turn on a transistor Qbc, thereby resetting the capacitor Ct1 and the base of a transistor Q.

Then, by a scanning pulse $\phi 21$ and a pulse $\phi bc$, the sensor signal S stored in the capacitor Ct2 is released to an output line OUT2 for a duration Tc in a similar manner.

The noise N and the sensor signal S supplied respectively to the output lines OUT1, OUT2 are subjected to a subtraction process, thereby eliminating the noise from the sensor signal S.

At the same time the output of the bipolar transistor Q is supplied to the output line OUT1 or OUT2 through the turn-on resistance of a transistor Qs1 or Qs2, thereby suppressing the feed-back through a diffusion capacitor and thus reducing the noise component.

However, in such conventional structure, the effective period of reading the signal stored in the capacitors Ct1, Ct2 is Tc., which, as shown in FIG. 2B, is very short after the subtraction of the resetting period for the retentive component, in the duration Tb of the scanning pulse.

For this reason the signal reading device utilizing the conventional scanning circuit is unable to provide a sufficiently high S/N ratio, thus being unable to achieve a high sensitivity when applied to an imaging sensor.

Also in the conventional scanning circuit, since with the feedback resetting structure in which each stage is reset by the output scanning pulse of a succeeding stage, there is required an additional exclusive circuit for resetting the last stage, and the simultaneous resetting of all the stages prior to the start of the scanning circuit is not possible.

In order to eliminate such drawbacks there has been proposed a structure of connecting resetting transistors respectively to the gate electrodes of the transistors M2 and giving a resetting pulse commonly to the gate electrodes of said resetting transistors, but the connection of another transistor to the gate electrode of the transistor M2 increases the parasite capacity thereof, thereby reducing the boot strap effect.

Also it is possible to activate the resetting transistor M4 of each stage by another pulse, instead of the scanning pulse from the succeeding stage, but the scanning circuit becomes inevitably complex for generating such another pulse.

SUMMARY OF THE INVENTION

An object of the present invention is to eliminate the drawbacks of the conventional technology explained above.

Another object of the present invention is to provide a signal reading device with an improved S/N ratio.

Still another object of the present invention is to provide an imaging device of a high sensitivity.

Still another object of the present invention is to provide a scanning circuit of a simple resetting structure.

The foregoing objects can be achieved, according to a feature of the present invention, by a scanning circuit composed of plural stages of unit circuits for releasing scanning pulses of two or more phases in succession according to multi-phase driving pulses, comprising setting means for setting said unit circuits at a constant state and switch means for activating said setting means of a preceding unit circuit by said scanning pulses, wherein said switch means is activated by a driving pulse different from the first-mentioned driving pulse.

The above-explained structure allows to obtain scanning pulses overlapped in time, thus having a duty ratio in excess of 50%. For example in case of driving a signal reading system, such scanning pulses allows to achieve an effective signal reading period longer than in the prior technology, thus achieving an improved S/N ratio and a higher sensitivity even in the high-speed operation.

Also according to another feature of the present invention, there is provided a scanning circuit in which unit circuits of plural stages are activated by two-phase driving pulses to release scanning pulses in succession from said unit circuits, wherein said unit circuit is equipped with a driving circuit for releasing said driving pulse as a scanning pulse, and a resetting circuit connected to the control terminal of said driving circuit, in which said resetting circuit is controlled by a driving pulse supplied to the succeeding stage thereby resetting said driving circuit.

Such use of the driving pulse supplied to the succeeding stage as the resetting pulse for the preceding stage enables the resetting of the preceding stage and the simultaneous resetting of all the stages with a simple structure.

Still other objects of the present invention, and the advantages thereof, will become fully apparent from the following description, which is to be taken in conjunction with the attached drawings.

BRIEF DESCRIPTION OF THE DRAWINGS

FIG. 5A is a chart showing the function of a signal reading system utilizing said embodiment;

FIG. 5B is a chart showing the function of a conventional system as a reference example;

DETAILED DESCRIPTION OF THE PREFERRED EMBODIMENTS

Now the present invention will be clarified in detail by embodiments thereof shown in the attached drawings.

Figure 1:
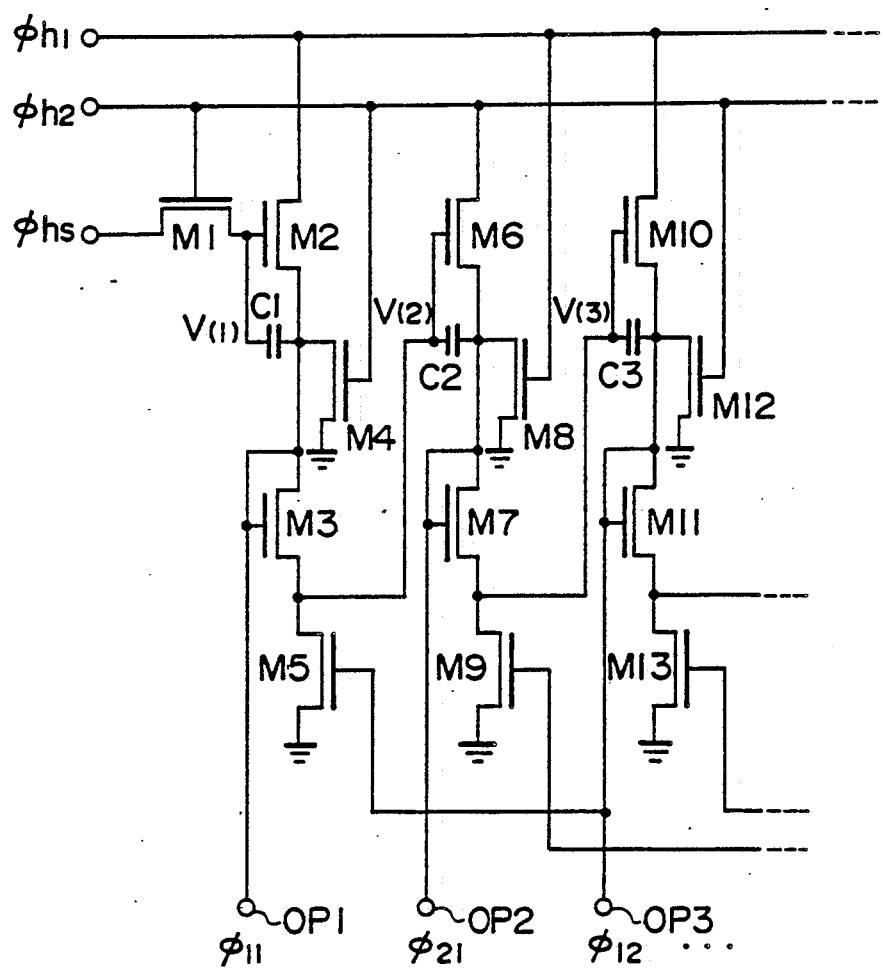
FIG. 1 is a schematic circuit diagram of a conventional scanning circuit.
Figure 3A:
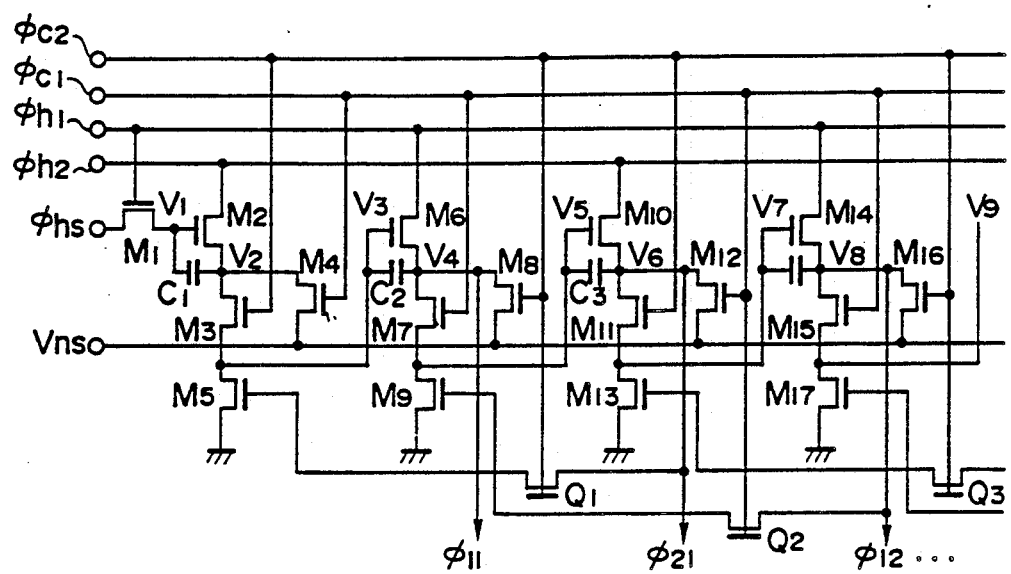
FIG. 3A is a schematic circuit diagram constituting a first embodiment of the scanning circuit of the present invention.

FIG. 3A is a schematic circuit diagram showing an embodiment of the scanning circuit of the present invention, wherein transistors of same or similar functions as those in the conventional example)shown in FIG. 1 are represented by same symbols.

In the present embodiment, driving pulses $\phi c1$, $\phi c2$, different from the driving pulses $\phi h1$, $\phi h2$ are utilized for on/off control of the transistors M3, M4, M7, M8, M11, M12 etc.

Also in circuits for the feedback of an arbitrary scanning pulse to the unit circuits of stages back for turning on the transistors M5, M9, M13 etc., the feedback lines are equipped with transistors Q1, Q2, ... which are on/off controlled by the driving pulse $\phi c1$ or $\phi c2$.

In the following the function of the present embodiment will be explained with reference to a timing chart shown in FIG. 3B.

At first, in a unit circuit of a preceding stage, during the presence of a start pulse $\phi hs$, a transistor M1 is rendered conductive by the pulse $\phi h1$ to elevate the potential V1. A transistor M2 shows a conductance corresponding to said potential V1, which is the gate potential of said transistor M2.

Then, when the pulse $\phi h1$ is downshifted and the pulse $\phi h2$ is upshifted, a potential V2 is elevated through the transistor M2 and is fed back to the gate thereof through a capacitor Cl, thereby further elevating the potential V1. Thus the conductance of the transistor M2 is further increased to transmit the pulse $\phi h2$ as the potential V2 without voltage drop.

A driving pulse $\phi c2$ of a shorter duration is entered in this state, whereby a transistor M3 is turned on to elevate a voltage V3 of the unit circuit of the first stage.

Then the driving $\phi h1$ of longer duration is upshifted, thereby elevating a voltage V4 through a transistor M6 and further elevating the voltage V3 through a capacitor C2. Consequently the pulse $\phi h1$ is released as a voltage V4, which is externally released as a scanning pulse $\phi11$.

Simultaneously the pulse $\phi h1$ turns on the transistor M1, thereby reducing the potential V1 to the reference potential.

While the voltage V4 is at the high level state, the driving pulse $\phi c1$ of shorter duration is upshifted, thereby turning on a transistor M7 of the unit circuit of the first stage and elevating a voltage V5 of the unit circuit of the second stage.

Then, the upshift of a driving pulse $\phi h2$ elevates a voltage V6 through a transistor M10 and a capacitor C3, thereby releasing a scanning pulse $\phi21$. At this moment the transistor Q1 of the feedback line remains turned off, whereby a transistor M5 also remains in the off state. Consequently the voltage V3 of the first stage remains at the high level, so that the scanning pulse $\phi11$ remains at the high level state.

Subsequently, at the downshift of the downshift of the driving pulse φh1, the voltage V4 (scanning pulse φ11) is shifted down, and the voltage V3 is also lowered.

A subsequent upshift of the driving pulse φc2 turns on a transistor M11 to elevate a voltage V7, and also turns on transistors M8, Q1 and M3.

The turning-on of the transistor M8 resets the voltage V4 to the reference potential Vns.

Also the turning-on of the transistor Q1 turns on a transistor M5 by means of the scanning pulse φ21, and reduces the voltage V3 to the ground potential. The turning-on of the transistor M3 resets the voltage V2 to the ground potential.

Figure 3B:
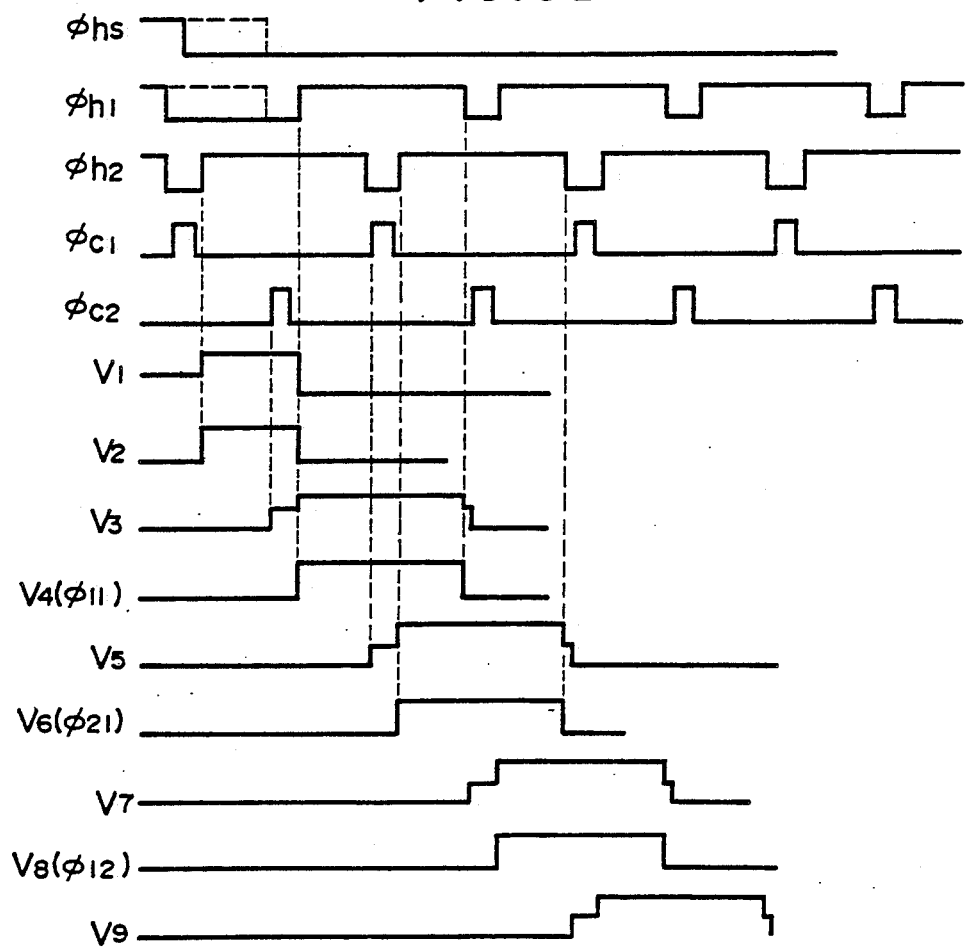
FIG. 3B is a timing chart showing the function thereof.

Therefore, as shown in FIG. 3B, scanning pulses φ11, φ21, φ12, ... are released in succession and in mutually overlapping manner at the timing of the driving pulses φh1 and φh2. The obtained scanning pulses have a long duration with a duty ratio in excess of 50%.

Figure 3C:
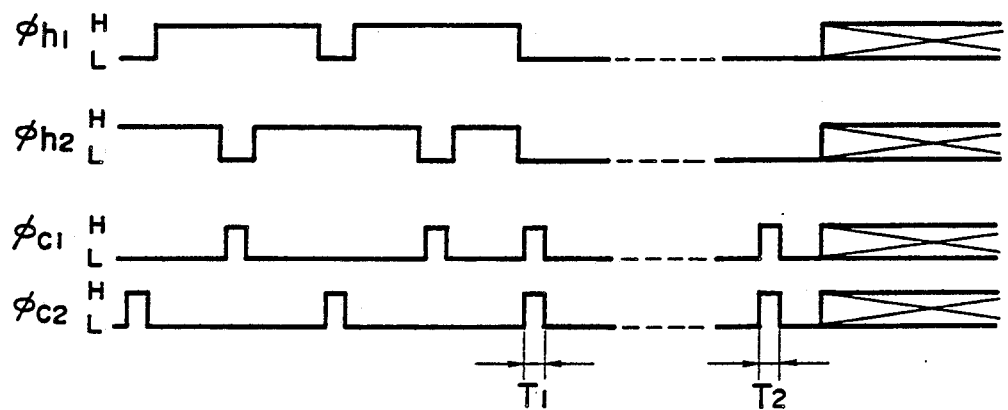
FIG. 3C is a timing chart showing a collective resetting in said embodiment.
Figure 3D:
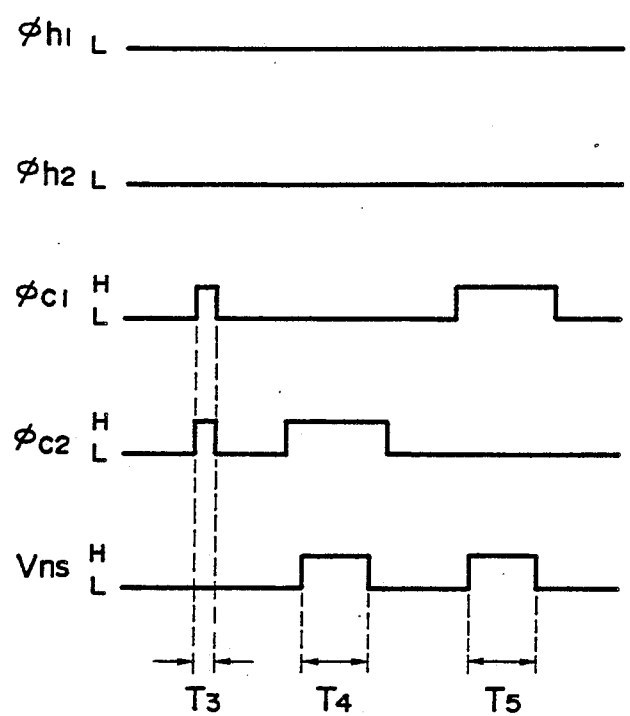
FIG. 3D is a timing chart showing a collective.high-level setting in said embodiment.

FIG. 3C is a timing chart showing a collective resetting in the present embodiment, and FIG. 3D is a timing showing a collective high-level setting.

As shown in FIG. 3C, the collective resetting is achieved by shifting the driving pulses φc1 and φc2 to the high level state at the same time while the reference voltage Vns is at a low level state. A period T1 shows a collective resetting in the course of releasing of scanning pulses, while a period T2 shows a collective resetting at the start of scanning operation.

Such collective resetting function is useful in an enlarged reading operation in an imaging device, as will be explained later.

The collective high-level setting is achieved, as shown in FIG. 3D, by shifting the driving pulses φc1 or φc2 during a high level state of the reference voltage Vns. In a period T4, the shift of the pulse φc2 to the high level state sets the scanning pulses φ11, φ12, ..., φ1n at the high level, and, in a period T5, the shift of the pulse φc1 to the high level state sets the scanning pulses φ21, φ22, ..., φ2n at the high level.

A period T3 indicates the collective resetting operation explained above.

Figure 3E:
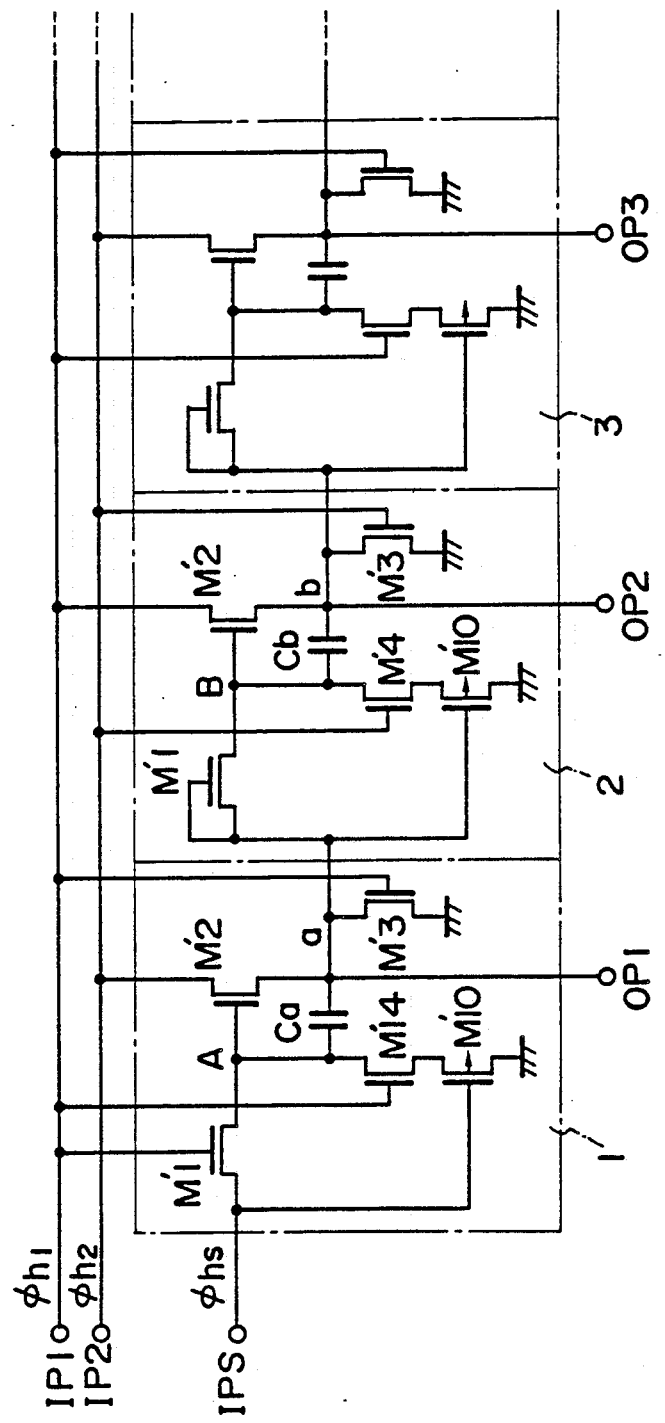
FIG. 3E is a circuit diagram showing a second embodiment of the scanning circuit of the present invention.

FIG. 3E is a circuit diagram of a second embodiment of the scanning circuit of the present invention.

The present embodiment is composed of units circuits 1, 2, 3, ... connected in multiple stages for releasing the scanning pulses in succession from output terminals OP1, OP2, OP3, ... of said unit circuits. As the structure and the function are essentially same for all the unit circuits, the following explanation will be concentrated on those of the unit circuits 1, 2 constituting the first and second stages.

The unit circuit 1 of the first stage is composed of a basic circuit consisting of transistors M'1, M'2 and M'3, and a serial circuit consisting of resetting transistors M'4 and M'10, wherein a parasite capacitance exists between the gate electrode of the transistor M'2 and a main electrode thereof.

The transistor M'1 is connected, at the gate electrode thereof, to an input terminal IP1, while at a main electrode, to an input terminal IPs, and at the other main electrode to the gate electrode of the transistor M'2. The aforementioned main electrode of the transistor M'2 is grounded through the transistor M'3 and is also connected to an output terminal OP1, and the other main electrode is connected to an input terminal IP2. The gate electrode of the transistor M'3 is connected to the input terminal IP1.

The gate electrode of the transistor M'2 is grounded through the serial circuit of the resetting transistors M'4 and M'10. The gate electrode of the transistor M'4 is connected to the input terminal IP1, and the gate electrode of the transistor M'10 is connected to the input terminal IPs.

The transistor M'10 is composed of a depression pMOS-FET of normal-on type which maintains the "on" state in the absence of a pulse at the gate electrode, while other transistors are composed of enhancement nMOS-FET of normal-on type.

The output terminal OP1 of the unit circuit 1 of the above-explained structure is connected to a main electrode of the transistor M'1 of the next unit circuit 2, and the gate electrode of the resetting transistor M'10 thereof. The unit circuit 2 is same as the unit circuit 1 of the first stage except that the gate electrode of the transistor M'1 is connected to a main electrode thereof, a main electrode of the transistor M'2 is connected to the output terminal OP2, the other main electrode thereof is connected to the input terminal IP1, and the gate electrodes of the transistors M'3 and M'4 are connected to the input terminal IP2. The gate electrode of the transistor M'1 may be connected to the input terminal IP2.

The scanning circuit is composed of connection, in succession, of odd stages respectively same as the unit circuit 1 and even stages respectively same as the unit circuit 2.

The input terminals IP1 and IP2 receive two-phase driving pulses φh1 and φh2, and the input terminal IPs receives a start pulse φhs.

Figure 3F:
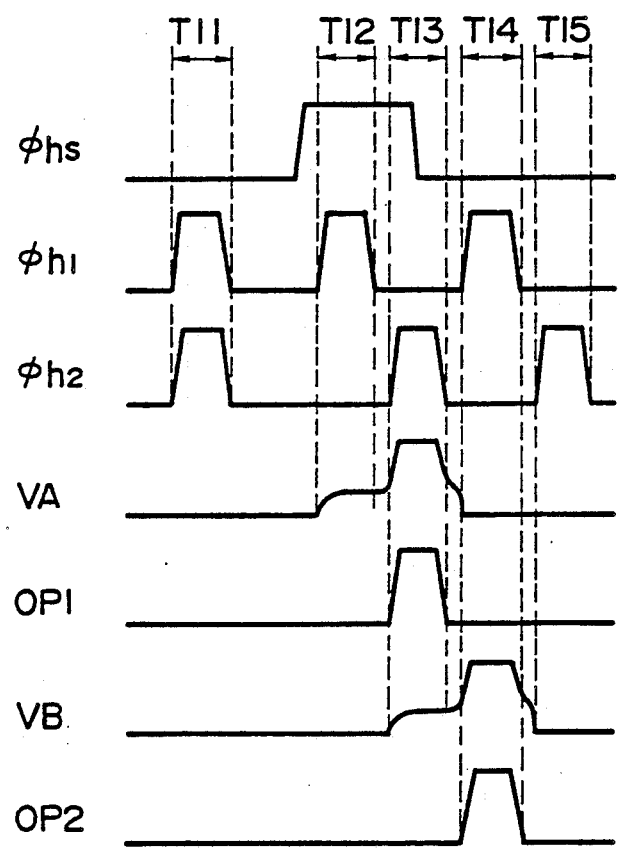
FIG. 3F is a timing chart showing the function of said embodiment.

In the following there will be explained the function of the present embodiment, with reference to a timing chart shown in FIG. 3F.

At first the pulses φh1 and φh2 are simultaneously shifted up, whereby the pulse φh1 is supplied to the gate electrodes of the transistors M'3 and M'4 of the unit circuits of odd stages, while the pulse φh2 is supplied to those of the transistors M'3 and M'4 of the even stages. Thus the output terminal of each stage is reset to the ground potential by the transistor M'3, and the gate electrode of the transistor M'2 of each stage is reset to the ground potential by the transistors M'4 and M'10. In this manner all the stages are collectively reset (period T11).

Then, the upshifts of the pulses φhs and φh1 turn on the transistor M'1 of the basic circuit in the first stage, thereby elevating the gate potential VA (at point A) of the transistor M'2, whereby the transistor M'2 is rendered conductive, with a conductance corresponding to the potential VA. Also the pulse φh1 turns on the transistor M'3, thereby charging the parasite capacitance Ca (period T12).

Then the pulse φh1 is shifted down and the pulse φh2 is shifted up, whereby the transistors M'1 and M'3 are turned off. At the same time the pulse φh2 elevates, through the transistor M'2, the potential Va, at a point a, of a main electrode of said transistor M'2. Said potential elevation at the point a is fed back to the gate electrode of the transistor M'2 through the capacitance Ca, thereby further elevating the potential at said point a and increasing the conductance of the transistor M'2. Thus the pulse b2 is transmitted to the output terminal OP1 without voltage drop.

At the same time the potential elevation of the point a turns of the transistor M'1 of the basic circuit of the next state, thereby elevating the gate potential VB, at a point B, of the transistor M′2, and charging the parasite capacitance Cb, in a period T13.

Then, when the pulse φh2 is shifted down and the pulse b1 is shifted up again, the pulse φh1 elevates the potential Vb, at a point b of a main electrode of the transistor M′2 of the unit circuit 2 through said transistor M′2, and said potential is fed back to the gate electrode thereof through the capacitance Cb thereby further elevating the potential of the point B. Thus the pulse φh1 is supplied as a scanning pulse to the output terminal OP2.

In the unit circuit 1, the potential at the point A is reset to the ground potential, as the transistor M′4 is turned on by the pulse φh1, and the serially connected transistor M′10 is conductive during the absence of the pulse φhs. Also the transistor M′3 is turned on to reset the potential at the point a, thereby discharging the parasite capacitance Ca. The unit circuit 1 is reset in this manner (period T14).

At the subsequent downshift of the pulse φh1 and upshift of the pulse φh2, the points B and b of the unit circuit 2 are reset in a similar manner as explained above, and the pulse φh2 is released from the output terminal OP3 of the unit circuit 3 (period T15).

Thereafter the scanning pulses are released in succession from the output terminals of the subsequent stages with the timing of the pulses φh1 and φh2, with the resetting of the preceding stage at each release.

Figure 3G:
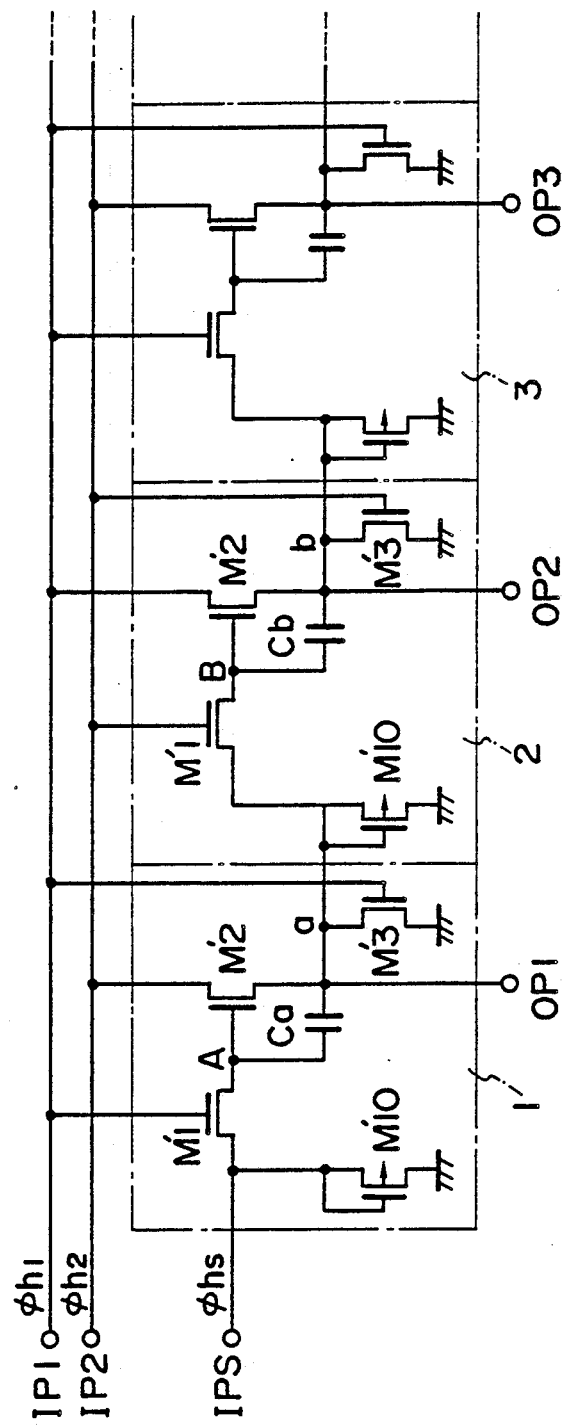
FIG. 3G is a circuit diagram showing a third embodiment of the scanning circuit of the present invention.

FIG. 3G is a circuit diagram of a third embodiment of the scanning circuit of the present invention.

The structure of this embodiment is same as that shown in FIG. 3E, except that the serial circuit of the resetting transistors M′4 and M′10 is replaced by a resetting transistor M′10 connected to a main electrode of the transistor M′1. The gate electrode and a main electrode of said transistor M′10 are commonly connected to a main electrode of the transistor M′1, and the other main electrode is grounded. Said transistor M′10 is normal-on type as explained before.

The function of the present embodiment will be explained in the following, with reference again to the timing chart shown in FIG. 3F.

At first, in a period T11, the pulses φh1 and φh2 are simultaneously shifted up, whereby the pulse φh1 turns on the transistors M′1 and M′2 of the unit circuits of the odd stages, and the pulse φh2 turns on those of the even stages. Thus the output terminals of the different stages are reset to the ground potential by the transistors M′3, and the gate electrodes of the transistors M′2 of said stages are reset to the ground potential by the transistors M′1 and M′10. In this manner all the stages are collectively reset.

The function in the subsequent period T12 and thereafter is same as that of the circuit shown in FIG. 3E, except that the resetting of the preceding stage, namely the resetting of the point A in the period T14 and the resetting of the point B in the period T15, is conducted by a serial circuit composed of the transistors M′1 and M′10.

As explained above, the present embodiment, in which a resetting circuit is composed of serial connection of the transistors M′1 and M′10, allows to use the transistor M′1 for charging and for resetting, thereby reducing the number of circuit components.

Also the resetting of the preceding stage and the collective resetting of all the stages can be achieved with a simple circuit structure, since the resetting of the preceding stage is achieved by the control of the resetting circuit with a driving pulse for the next stage.

Furthermore, if the resetting circuit resetting circuit is composed of an enhancement nMOS-FET and a depression pMOS-FET, the channel doping step for regulating the nMOS threshold voltage in the manufacturing process of the integrated circuit can be utilized as the channel doping step for regulating the pMOS-FET threshold voltage, so that the manufacturing process can be simplified.

Figure 4:
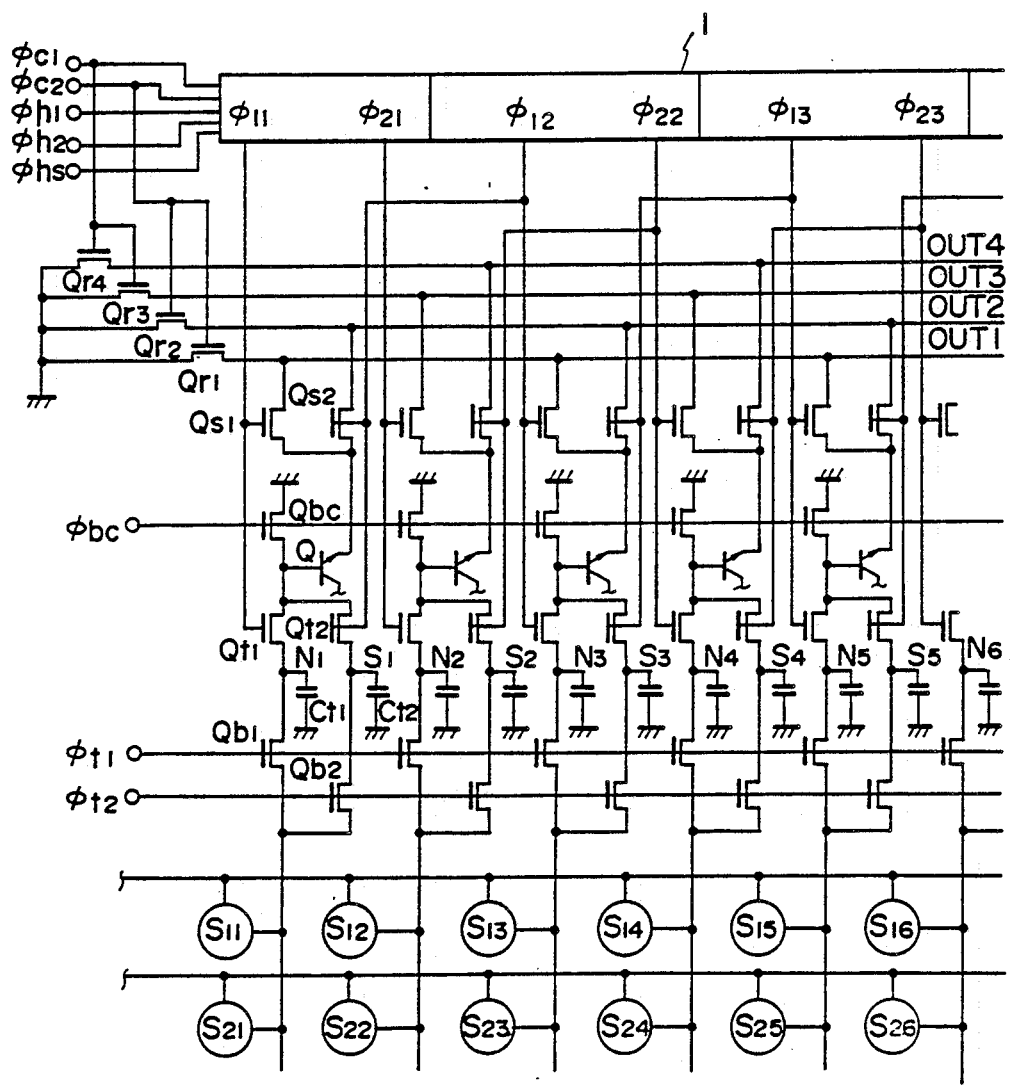
FIG. 4 is a schematic circuit diagram of a signal reading system of an image sensor utilizing said embodiment.

FIG. 4 is a schematic circuit diagram of a signal reading system of an image sensor, utilizing the foregoing embodiment.

Said image sensor is provided with an m×n matrix arrangement of photosensor cells S11, S12 etc. Said cells are selected in succession by an unrepresented vertical scanning circuit, and sensor signals S are respectively released from the cells of a selected row. As will be explained later, said sensor signals S contain noise components N of the cells.

For example, when the first row is selected, a pulse φt2 turns on transistors Qb2, and the sensor signals S are stored in capacitors Ct2 by the reading operation of the cells S11–S1n.

Then the cells S11–S1n are reset, and transistors Qb1 are turned on by a pulse φt1. Subsequently said cells are read again to accumulate the noise components N of the cells into capacitors Ct1.

In this manner the noise components N of the cells are stored in the capacitors Ct1, while the sensor signals S containing the noises are stored in the capacitors Ct2, and are supplied to output lines OUT1–OUT4 according to the function of the present embodiment, as will be explained in more detail in the following.

Structure of signal reading system

The capacitors Ct1 and Ct2 corresponding to each column of the area sensor are connected, respectively through transistors Qt1 and Qt2, in common to the base terminal of a buffer amplifier Q. Said base terminal is grounded through a transistor Qbc, and the gate electrodes of the transistors Qbc commonly receive a pulse φbc.

The collector electrode of the buffer amplifier Q receives a predetermined positive voltage. Also the emitter electrode of the buffer amplifier Q is connected, in an odd column of the area sensor, through a transistor Qs1 to the output line OUT1 and through a transistor Qs2 to the output line OUT2, and, in an even column, to the output lines OUT3, OUT4 in a similar manner.

The release of the output of the bipolar transistor Q through the transistor Qs1 or Qs2 to the output lines enables to limit the current by the on-state resistance of said transistors as will be explained later, thereby reducing the noises. This is effective when the scanning pulses are wide, as in the present invention.

The scanning pulses φ11 and φ21 from the scanning circuit 1 are respectively supplied to the gate electrodes of the transistor Qt1 and Qs1 corresponding to the first and second columns of the area sensor.

The scanning pulse φ12 is supplied, in addition to the gate electrodes of the transistors Qt2 and Qs2 corresponding to the first column, to the gate electrodes of the transistors Qt1 and Qs1 corresponding to the third column. Also the scanning pulse φ22 is supplied, in addition to the gate electrodes of the transistors Qt2 and Qs2 corresponding to the second column, to the gate electrodes of the transistors Qt1 and Qs1 corresponding to the fourth column. Subsequent scanning pulses φ13, φ23, φ14, . . . are also supplied in a similar manner.

The output lines OUT1–OUT4 are grounded respectively through transistors Qr1–Qr4. The gate electrodes of the transistors Qr1 and Qr4 receive a driving pulse φc2, while those of the transistors Qr2 and Qr3 receive a driving pulse φc1.

Function of the signal reading system

FIG. 5A is a chart showing the function of a signal reading system of the present employing the present embodiment, and FIG. 5B is a chart showing the function of a conventional system as a reference example.

When the scanning pulse φ11 of a long duration is released from the scanning circuit 1 of the present embodiment while the noise component N and the sensor signal S are respectively stored in the capacitors Ct1 and Ct2, the transistors Qt1 and Qt2 corresponding to the first column are turned on as explained above.

Thus the noise component N1 corresponding to the first column is released to the output line OUT1 through the buffer amplifier Q (see column of scanning pulse φ11 in FIG. 5A).

Then, when the scanning pulse φ21 is released, the transistors Qt1 and Qs1 corresponding to the second column are turned on, whereby the noise component N2 is released to the output line OUT3 through the buffer amplifier Q (see column of scanning pulse φ21).

Subsequently, in response to the release of the scanning pulse φ12, the sensor signal S1 and the noise component N3 are respectively released to the output lines OUT2 and OUT1 in a similar manner. Thereafter the sensor signals and noise components are released in succession as shown in FIG. 5A.

The output lines OUT1 and OUT2 are reset by the transistors Qr1, Qr2 at the timing of the driving pulses φc2, while the output lines OUT3 and OUT4 are reset by the transistors Qr3, Qr4 at the timing of the driving pulses φc1.

After the lapse of a predetermined time from the upshift of each scanning pulse, the pulse φbc is shifted up to turn on the transistor Qbc, whereby the capacitor Ct1 or Ct2 corresponding to a column from which the signals have been read is reset.

Figure 2A:
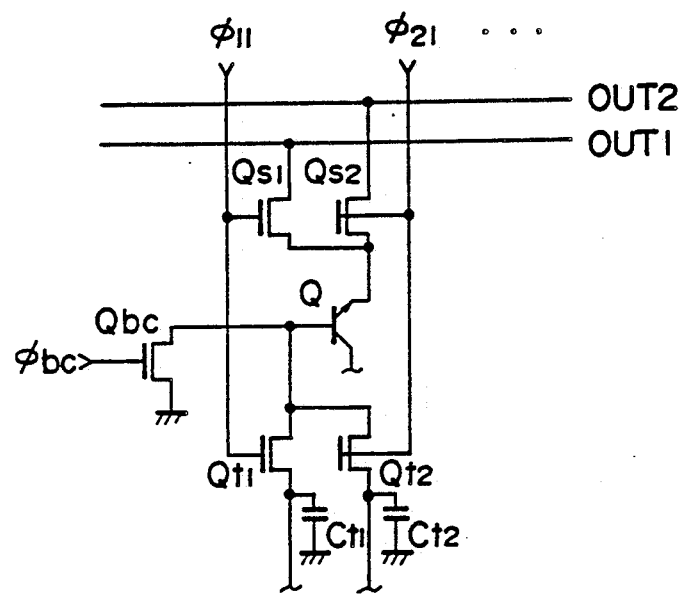
FIG. 2A is a circuit diagram showing an example of a signal reading device utilizing such conventional scanning circuit.
Figure 2B:
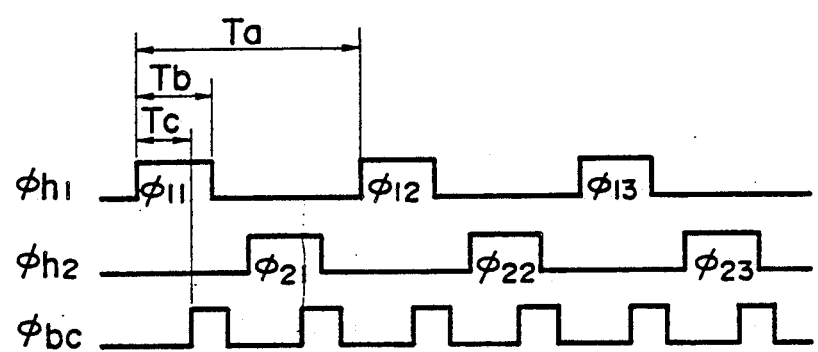
FIG. 2B is a timing chart showing an example of the function thereof.

FIG. 5B shows a conventional driving method for comparison. In the conventional system, since the signal reading is conducted by alternately using the driving pulses φh1 and φh2, the effective signal reading period is shortened as already explained in relation to FIG. 2B.

The signal reading system is not limited to that of the above-explained image sensor, but can be modified in various manners.

Figure 6A:
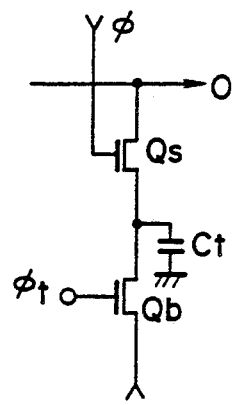
FIGS. 6A through 6C are schematic circuit diagrams showing other examples of the signal reading system.
Figure 6B:
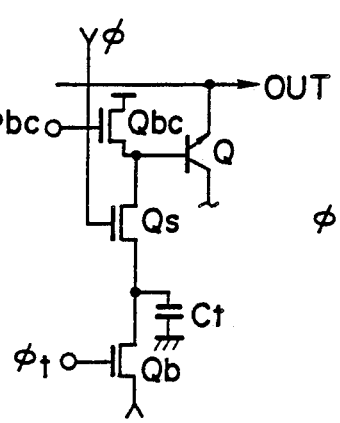
Figure 6C:
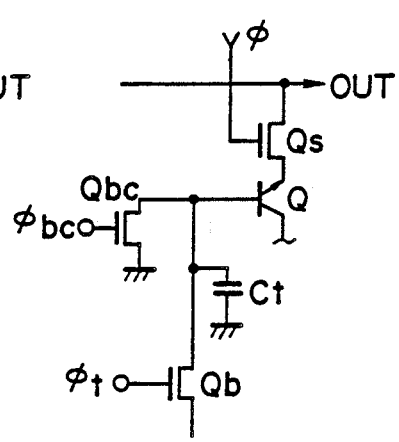

FIGS. 6A through 6C are schematic circuit diagrams showing other embodiments of the signal reading system.

FIG. 6A shows a circuit of output by capacity division, while FIG. 6B shows a circuit having a scanning switch at the base of a bipolar transistor, and FIG. 6C shows a circuit having a scanning switch at the emitter of a bipolar transistor.

In the signal reading system of the present embodiment, as already explained above, the output of the bipolar transistor amplifier Q is released to the output line OUT through the turn-on resistance of the transistor Qs1 or Qs2. Said turn-on resistance limits the output current, thereby contributing to the noise reduction. The current limitation can be achieved not only by a resistor or the turn-on resistance of a transistor, but also by a slower upshift of the scanning pulse.

Figure 7A:
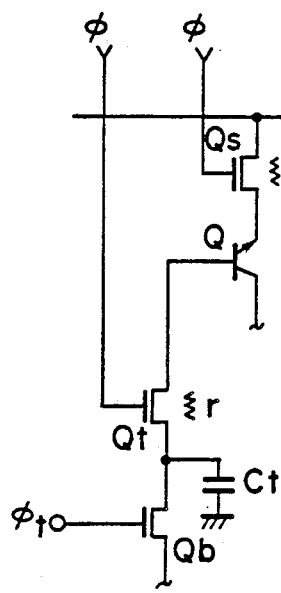
FIGS. 7A through 7C are block diagrams showing current limiting means.
Figure 7B:
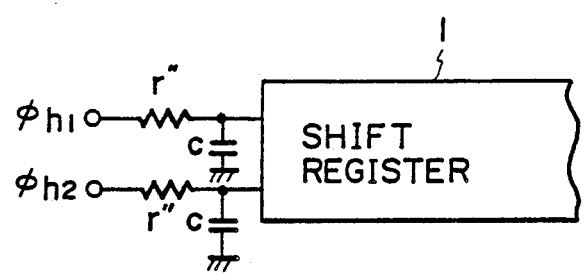
Figure 7C:
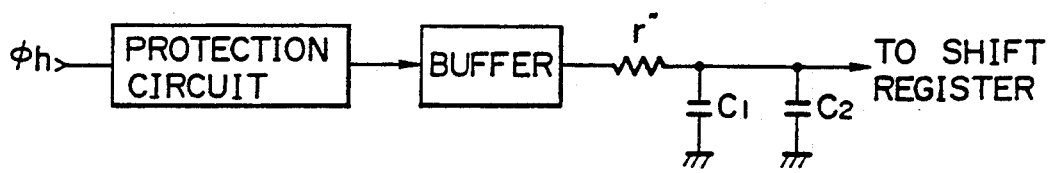

FIGS. 7A through 7C are schematic views showing different current limiting means.

FIG. 7A shows a method of utilizing the turn-on resistance r, r' of transistors, employed in the above-explained signal reading system.

FIG. 7B shows a method of relaxing, with an RC time constant, the upshift of the driving pulses φh1 and φh2 supplied to the scanning circuit 1.

Inversely, the time constant may become too large due to the wiring resistances and the parasite capacitances in the integrated circuit. In such case, as shown in FIG. 7C, there may be provided a buffer circuit, after the protective circuit, for reducing the impedance, followed by a resistor r" and a capacitor C1 or C2 according to the design value.

Figure 8:
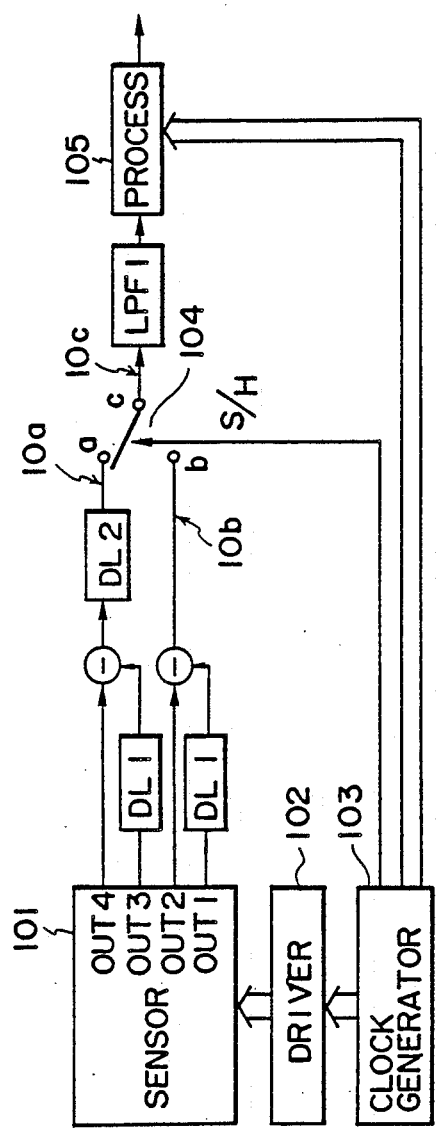
FIG. 8 is a block diagram showing an imaging device utilizing the above-explained image sensor.
Figure 9:
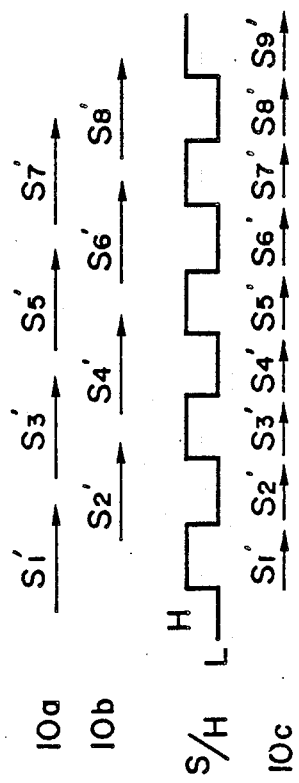
FIG. 9 is a chart showing the function of said imaging device.

FIG. 8 is a schematic block diagram of an example of imaging device utilizing the image sensor explained above, and FIG. 9 is a chart showing the function thereof.

In FIG. 8, a sensor 101 corresponds to the image sensor shown in FIG. 3.

The driving pulses φh1, φh2, φc1, φc2, φhs, φbc etc. are supplied from a driver 102, which functions according to a clock signal from a clock generator 103.

As shown in FIG. 5A, the output lines OUT1 and OUT3 of the sensor 101 release the noise components N, while the output lines OUT2 and OUT4 release the sensor signals S with a delay of one cycle from the corresponding noise components, according to the timing of the scanning pulses φh1 and φh2.

Consequently, in order to eliminate the noise component Ni from an arbitrary sensor signal Si, it is necessary to delay the noise component Ni by one cycle and to effect subtraction of two signals. For this purpose delay lines DL1 of one cycle period are connected to the output lines OUT1 and OUT3.

The output lines OUT1 and OUT2 release the sensor signals and noise components of odd columns of the area sensor, while the output lines OUT3 and OUT4 release those of even columns.

Consequently, in order to restore the original arrangement of the signals of the odd and even columns, there are provided a delay line DL2 and a sample-hold circuit 104, which selects a terminal a or b according to S/H pulses from the clock generator 103.

As shown in FIG. 5, the output 10a of the delay line DL2 is the sensor signals S1', S3', . . . of odd columns after noise component elimination, while the output 10b is the sensor signals S2', S4', . . . of even columns after noise component elimination. Thus the sample-hold circuit 104 releases an output signal 10c composed of point-sequential sensor signals S1', S2', S3', . . . according to the S/H pulses.

The output signal 10c is subjected to the elimination of high frequency components by a low-pass filter LPF1, and is converted for example into a television signal by a process circuit 105.

The present embodiment, being capable of supplying scanning pulses of a large duration, allows to obtain the sensor signals S of reduced noises and the noise components N by the current limiting means. Consequently the imaging device can provide a sensor signal S' of a high S/N ratio, obtained after the elimination of the noise component N from the sensor signal S, thereby achieving a high sensitivity.

Figure 10:
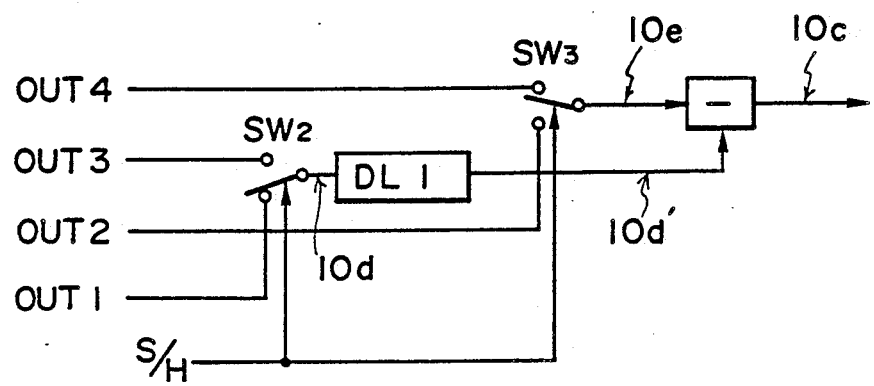
FIG. 10 is a schematic circuit diagram showing a signal processing system in another imaging device.
Figure 11:
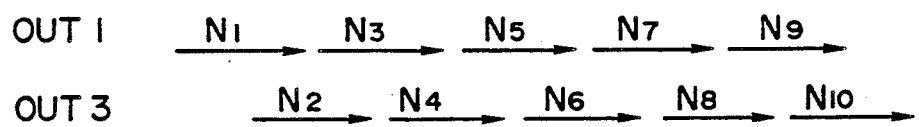
FIG. 11 is a chart showing the function of said signal processing system.
Figure 11:
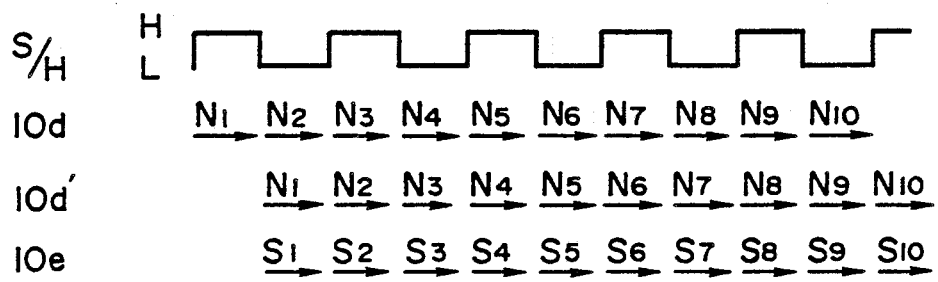

FIG. 10 is a schematic circuit diagram of a signal processing system in another imaging device, and FIG. 11 is a chart showing the function thereof.

In this signal processing system, the sensor signals S and the noise components N are separately formed as point-sequential signals by switches SW3 and SW2. The output signals 10d of the switch SW2 are delayed by a delay line DL1 as output signals 10d' for phase matching, and then subtracted from the point sequential sensor signals 10e to obtain sensor signals 10c without the noise components.

This signal processing system can dispense with a delay line, in comparison with the circuit shown in FIG. 8.

Figures 12A, 12B:
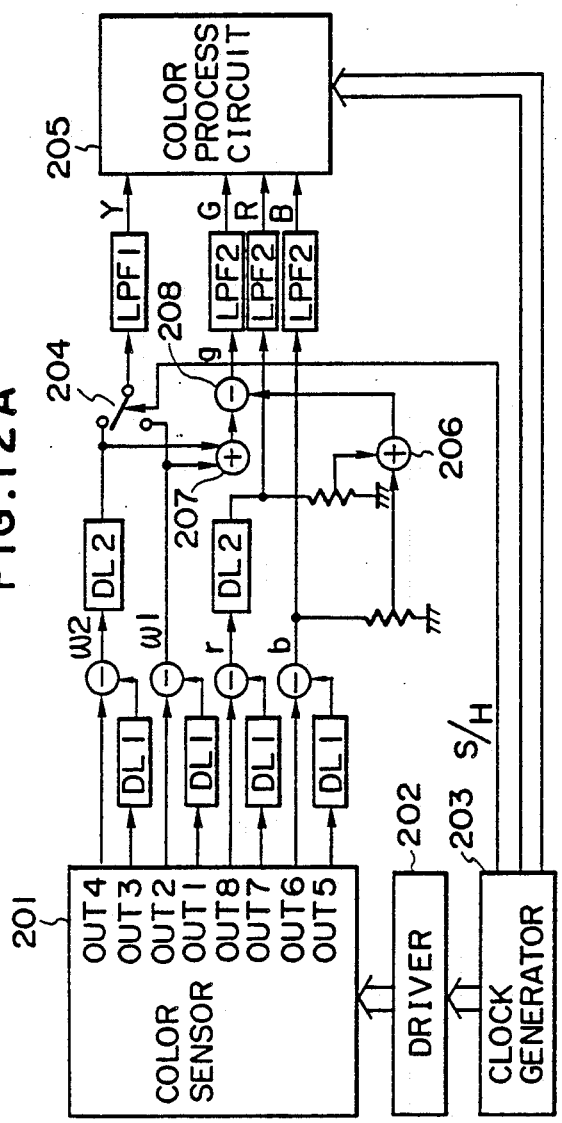
FIG. 12A is a block diagram of an example of color imaging device.
FIG. 12B is a schematic view showing an example of arrangement of color filters thereof.

FIG. 12A is a schematic block diagram showing an example of color imaging device, and FIG. 12B is a schematic view showing an example of the arrangement of color filters thereof.

A color sensor 201 has the structure of the embodiment shown in FIG. 3 on both sides of an area sensor, and has eight output lines OUT1–OUT8.

FIG. 12B shows an example of the arrangement, wherein W, R and B respectively stand for white, red and blue.

The output line OUT2 releases the signals W1, W3, ... of odd rows, the output line OUT4 releases the signals W2, W4, ... of even rows, the output line OUT6 releases the signals R1, R3, ... of odd rows, and the output line OUT8 releases the signals B2, B4, ... of even rows. Other output lines OUT1, 3, 5 and 7 are used for the respectively corresponding noise components.

The sensor signals of respective colors are subjected to the elimination of noise components by the subtractions explained above, whereby obtained are white signals w1, w2, a red signal r and a blue signal b.

The white signals w1, w2 are constructed into the original arrangement in the above-explained manner by a sample-hold circuit 204, and are supplied, through a low-pass filter LPF1, as a luminance signal Y to a color process circuit 205.

An adder 206 adds the red signal r and the blue signal b with suitable coefficients ($k_1 r + k_2 b$), and an adder 207 adds the white signals w1 and w2 (w1+w2). The obtained results are subjected to subtraction in a subtractor 208 to obtain a green signal g.

The color signals r, g, b thus obtained are supplied, through a low-pass filter LPF2, as color signals R, G, B to the color process circuit 205 together with the luminance signal Y, for conversion for example into a television signal.

In the following there will be explained an application of the collective resetting function of the present invention.

Figure 13A:
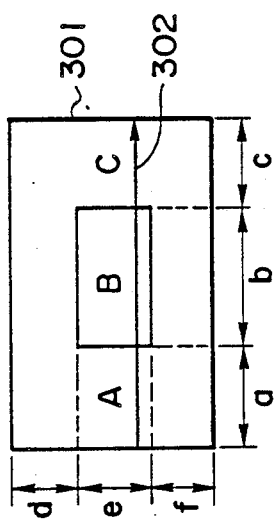
FIG. 13A is a schematic view showing the principle of enlarged reading.
Figure 13B:
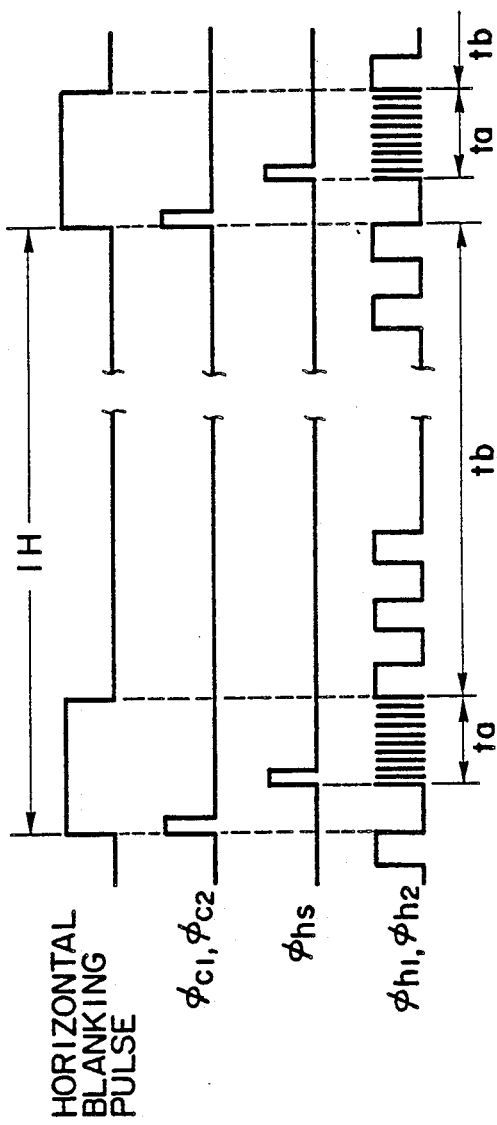
FIG. 13B is a schematic timing chart showing the function of an image sensor at the enlarged reading.

FIG. 13A is a schematic view showing the principle of enlarged reading, and FIG. 13B is a schematic timing chart showing the driving method of the image sensor in the enlarged reading.

In case of enlarged reading of the signals of an area B of the image sensor 301, it is necessary to eliminate unnecessary portions a and c in a horizontal scanning 302, during the horizontal blanking period.

During said horizontal blanking period, a start pulse $\phi hs$ is entered to release the scanning pulses in synchronization with high-speed driving pulses $\phi h1$ and $\phi h2$, whereby the signals of the unnecessary portion a are transferred at a high speed in a period ta.

Then the signals of the area b to be enlarged are transferred at a low speed in an effective period tb, and pulses $\phi c1$ and $\phi c2$ are then shifted up for collective resetting to initialize the scanning circuit 1. In this manner the unnecessary portion c can be eliminated without the unnecessary scanning of the scanning circuit 1. Consequently the unnecessary scanning period of the scanning circuit 1 is limited to the period ta, thus significantly reduced in comparison with the prior technology.

As detailedly explained in the foregoing, the scanning circuit of the present invention is capable of releasing the scanning pulses mutually overlapping in time, with a duty ratio in excess of 50%. Therefore, for example in an application for driving a signal reading system, the effective signal reading period can be made longer than in the conventional technology, so that a high S/N ratio and a high sensitivity can be attained even in a high-speed operation.

We claim:

1. A scanning circuit composed of unit circuits connected in plural stages, for outputting scanning pulse signals in succession from said unit circuits according to first multi-phase driving pulse signals, said scanning circuit comprising:
   setting means for setting said unit circuits in a reset state; and
   supplying means for supplying second driving pulse signals different from the first multi-phase driving pulse signals, for operating said setting means.

2. A scanning circuit according to claim 1, further comprising at least one line of photoelectric converting elements arranged to be scanned by said scanning pulse signals.

3. A scanning circuit according to claim 1, wherein said second driving pulse signals have multi-phase.

4. A scanning circuit according to claim 1, further comprising first and second switches which are simultaneously operated by each of said scanning pulse signals.

5. A scanning circuit according to claim 4, further comprising second memory means for storing a photoelectric conversion signal component and a noise component of a photoelectric conversion cell connected to said second switch.

6. A scanning circuit according to claim 4, further comprising first memory means for storing a noise component of a photoelectric conversion cell connected to said first switch.

7. A scanning circuit according to claim 6, further comprising second memory means for storing a photoelectric conversion signal component and a noise component of a photoelectric conversion cell connected to said second switch.

8. A scanning circuit according to claim 7, further comprising distributing means for selectively distributing an output of a photoelectric conversion cell to said first and second memory means.

9. A scanning circuit according to claim 1, wherein a duty cycle of each of said first multi-phase driving pulse signals is more than 50%.

10. An image pickup apparatus comprising:
   (a) a plurality of photoelectric conversion cells;
   (b) a first memory for storing a noise component included in an output of each of said plurality of cells;
   (c) a second memory for storing a noise component and a photoelectric conversion signal component included in an output of each of said plurality of cells;

(d) a shift register including a plurality of unit circuits for reading out respective signals stored in said first and second memories; and (e) generating means for generating first multi-phase pulse signals which drive each of said plurality of unit circuits of said shift register and for generating second multi-phase pulse signals which are different from said first multi-phase signals, in order to reset each of said plurality of unit circuits.

11. An image pickup apparatus according to claim 10, wherein said first and second memories include capacitor means.

12. An image pickup apparatus according to claim 10, wherein said plurality of unit circuits include bootstrap circuits respectively.

13. A scanning circuit for outputting scanning pulse signals in succession from unit circuits of plural stages by driving said unit circuits alternately with two-phase driving pulse signals in response to a start pulse signal, wherein each of said circuits comprises a drive circuit for outputting a scanning pulse signal based on one of the two-phase driving pulse signals, wherein a resetting circuit is connected to a control terminal of said drive circuit, wherein said resetting circuit is controlled by one of the two-phase driving pulse signals supplied to a next stage drive circuit to effect resetting control of said drive circuit, and further comprising:

(a) a plurality of photoelectric conversion cells;

(b) a first memory for storing a noise component included in an output of each of said plurality of cells;

(c) a second memory for storing a noise component and a photoelectric conversion signal component included in an output of each of said plurality of cells; and (d) a switch means controlled by said scanning pulse signals for simultaneously reading out predetermined signals stored in said first and second memories.

14. A scanning circuit according to claim 13, wherein said first and second memories include capacitor means.

15. A scanning circuit according to claim 13, wherein said plurality of unit circuits include bootstrap circuits respectively.

16. A scanning circuit according to claim 13, further comprising distributing means for selectively distributing an output of a photoelectric conversion cell to said first and second memory means.

17. A scanning circuit according to claim 13, wherein said resetting circuit is composed of a serial circuit of a first normally-off transistor and a second normally-on transistor, in which said first transistor is controlled by one of the two-phase driving pulse signals supplied to a next stage while said second transistor is controlled by the start pulse signal or a scanning pulse signal output from said drive circuit of a preceding stage.

18. A scanning circuit according to claim 13, further comprising at least one line of photoelectric converting elements arranged to be scanned by said scanning pulse signals.

* * * * *